United States Patent [19]
Nishi

[11] 4,106,045
[45] Aug. 8, 1978

[54] FIELD EFFECT TRANSISTORS

[75] Inventor: Yoshio Nishi, Yokohama, Japan

[73] Assignee: The President of the Agency of Industrial Science and Technology, Tokyo, Japan

[21] Appl. No.: 686,537

[22] Filed: May 14, 1976

[30] Foreign Application Priority Data

May 20, 1975 [JP] Japan .................................. 50-59298

[51] Int. Cl.² ............................................ H01L 29/78
[52] U.S. Cl. .......................................... 357/23; 357/4; 357/89
[58] Field of Search ............................... 357/4, 23, 89

[56] References Cited

U.S. PATENT DOCUMENTS

| 3,890,632 | 6/1975 | Ham et al. | 327/23 |
| 3,958,266 | 5/1976 | Athanas | 357/4 |

OTHER PUBLICATIONS

IBM Tech. Bul., vol. 18, No. 10, Mar. 1976, Abbas et al.

*Primary Examiner*—Edward J. Wojciechowicz
*Attorney, Agent, or Firm*—Flynn & Frishauf

[57] ABSTRACT

A field effect transistor includes a thin silicon layer formed on a sapphire substrate and having source, gate and drain regions. A buried layer of the same conductivity type as that of the gate region and a higher impurity concentration than that of the gate region at the lower portion of a junction between the source and gate regions.

5 Claims, 6 Drawing Figures

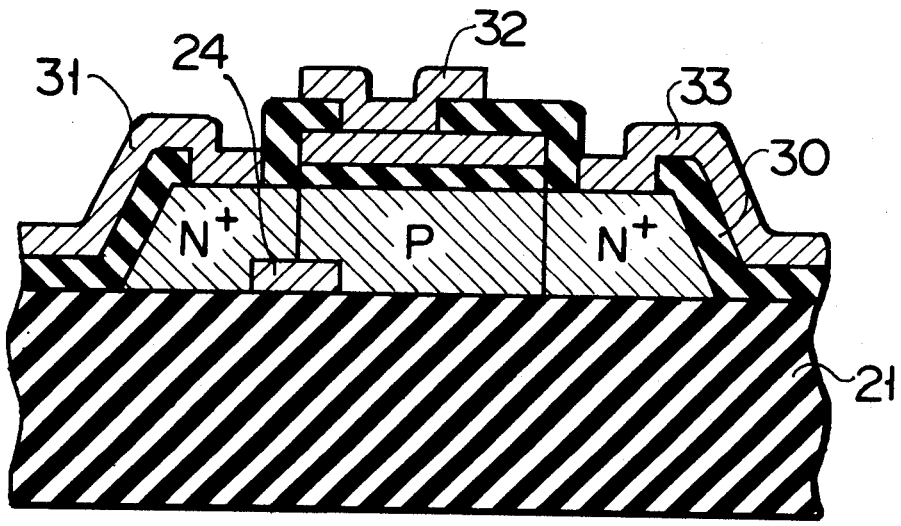

FIELD EFFECT TRANSISTORS

Background of the Invention

This invention relates to a semiconductor device, and more particularly to a field effect transistor having a semiconductor layer-insulator substrate structure wherein a semiconductor layer is provided on an insulator substrate and source and drain regions are formed in said layer.

Known as a typical example of this type of semiconductor device is the one wherein, as shown in FIG. 1, a plurality of silicon layers 11 (in FIG. 1 only one layer is representatively shown) are provided on a sapphire substrate 10, and a source region 12 and a drain region 13 are formed in the layer 11. In this case, the silicon layer 11 has one conductivity type, for example, a p conductivity type and is formed as very thin as about one micron. The source region 12 and drain region 13 each have an $n^+$ conductivity type and are formed by deeply diffusing impurities from the upper surface of the silicon layer 11 up to the substrate 10, whereby a decrease in the drain capacity is accomplished. Further, a gate electrode 15 is disposed on the upper surface of the silicon layer 11 between the source region 12 and the drain region 13 through a gate insulating film 14, said source and drain regions being attached with a source electrode 16 and a drain electrode 17, respectively.

In a prior art field effect transistor having the above-mentioned construction, it is impossible to form a substrate terminal, i.e., a terminal of the silicon layer 11 with a simple structure. Usually, for this reason, the silicon layer 11 is used with the floating potential kept intact. In the case of the transistor being kept in an "OFF" state, therefore, the substrate potential is determined depending upon the leakage leak current of the $n^+p$ junction and/or the ratio of division of the junction capacity between the source region and the substrate to the junction capacity between the drain region and the substrate. In the case of the transistor being kept in an "ON" state, the substrate potential becomes nearly equal to the source potential. Where, in this way, the substrate potential is different in case of "ON" state and in case of "OFF" state, this switching operation is delayed, so that where the transistor is used in, for example, a logic circuit, the delay time disadvantageously becomes long. Further, where no provision is made for a substrate terminal, the substrate potential is unstable and causes an abnormal leak current to flow between the source region and the drain region. Thus, conventionally, characteristically undesirable phenomena take place.

SUMMARY OF THE INVENTION

Accordingly, it is the object of the invention to provide a field effect transistor which, even in the case of no substrate terminal being provided therefor, causes no delay of the switching operation and yet suppresses the occurrence of abnormal leakage current to a small value.

DETAILED DESCRIPTION OF THE PREFERRED EMBODIMENT

Figure 1:
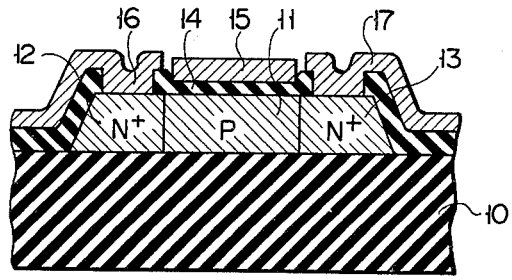
FIG. 1 is a sectional view showing a prior art field effect transistor.
Figure 2A:
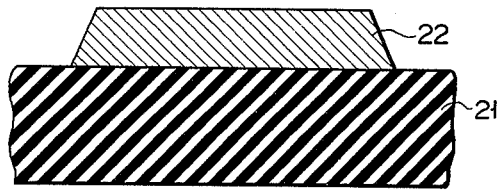
FIGS. 2A to 2E are sectional views showing respectively the steps of manufacturing a field effect transistor according to an embodiment of the invention in order to explain an example of the method of manufacturing said transistor.
Figure 2B:
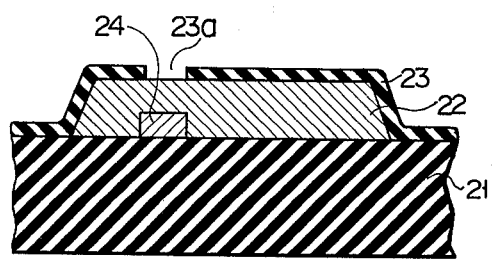

On a substrate 21 made of an electrically insulating material such as sapphire a p conductivity type silicon film 22 having a (111) face, a thickness of about $0.7\mu$ and an impurity concentration of $3 \times 10^{15} cm^{-3}$ is formed by the vapor phase growth method. Next, by removing, as shown in FIG. 2A, prescribed portions of the film 22 by a photoetching method an island-shaped silicon layer 22 is formed (in the Figures only one silicon layer 22 is shown but actually a plurality of silicon layers 22 are formed). By a thermal decomposition method a silicon dioxide film 23 is formed on the upper surface of the sapphire substrate 21 and also on the surface of the silicon layer 22. By a selective etching method an opening 23a is formed in a portion of the insulating film 23 corresponding to the boundary section between source and channel regions to be formed. This substrate is disposed within an ion implantation apparatus, and while the substrate is being heated up to a temperature of about 800° C to 1000° C, protons are injected from the opening 23a into the silicon layer 22 by using an appropriate level of accelerating voltage, so that aluminum is diffused from the sapphire substrate 21 into a proton-injected portion of the silicon layer 22 to form, as shown in FIG. 2B, a $p^+$ conductivity type buried layer 24 having an impurity concentration of $1 \times 10^{17} cm^{-3}$. The technique of utilizing the increased speed diffusion phenomena of impurities based on such proton injection is known and in actuality is carried out as follows.

The accelerating voltage for proton injection is determined by the depth taken from the surface from a portion of which the increased speed diffusion is desired to start, while the length of proton projection time is determined from the increased speed coefficient of diffusion and the distance of diffusion as resulting from the increased speed diffusion.

Figure 2C:
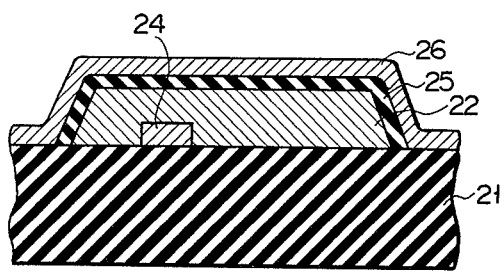
Figure 2D:
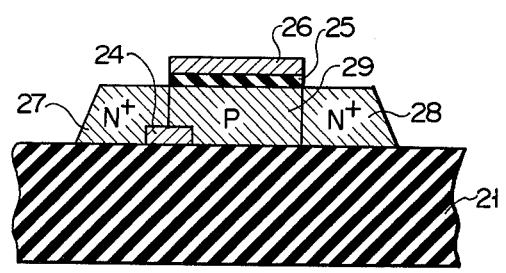
Figure 2E:
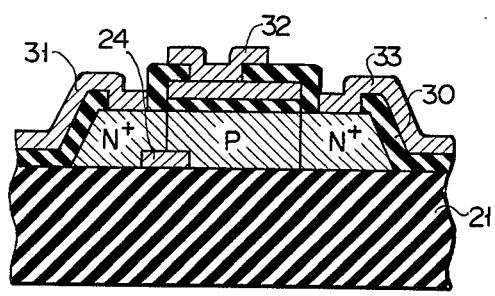

To consider, with respect to the silicon layer, the case where use is made of an ion current of about $10^{-6}$ $\mu Acm^{-2}$, about 10% of the amount of protons not including the amount of proton loss due to, for example, nonelastic scattering contributes to the formation of holes, and the accelerating voltage is 250 kV on the assumption that the energy required to cut off the silicon atom-to-atom's bondage be about 25eV, holes of about $2 \times 10^{16} cm^{-3}$ are produced and, when account is further taken of the holes resulting from the return of silicon atoms, an increased speed diffusion coefficient of about $10^3 \times D$ (where D is a self-diffusion coefficient) can be obtained. Note that in this embodiment the projected range of protons is so determined that holes of maximum concentration may be produced with the range of between $\pm 100 \overset{\circ}{A}$ as measured from the boundary surface between the silicon layer 22 and the sapphire substrate 21. The thickness of the high impurity concentration buried layer 24 thus formed is about half the thickness of the silicon layer 22, while the impurity concentration thereof is $1 \times 10^{17} cm^{-3}$. Next, said insulating film 23 is entirely removed, and a silicon dioxide film 25 is newly formed on the surface of the silicon layer 22 by thermal oxidation, and a polycrystalline silicon film 26 is formed by the vapor phase growth of silicon on the insulating film 25 as shown in FIG. 2C. This polycrystalline silicon film 26 is removed by selective etching except for a portion corresponding to the gate region, and thereafter, with this remaining polycrystalline silicon film 26 used as a mask, the insulating film 25 is removed by etching so as to permit a portion right below the remaining film 26 to be left nonetched, and thereafter an impurity, for example, phosphorus, is diffused into the silicon layer 26 and simultaneously diffused also into the silicon layer 22 from an open space formed by removing of the films 25, 26, thereby to make the film 26 have a low resistance and simultaneously to form $n^+$ conductivity type source and drain regions 27, 28 as shown in FIG. 2D to define a gate region 29 between the regions 27 and 28. The diffusion requirements at this time such as, for example, a diffusion time are so determined that the impurity may reach the sapphire substrate 21, namely, the source region 27 and the drain region 28 may be formed over an entire thickness of the silicon layer 22. As apparent from FIG. 2D, said buried layer 24 is situated extending from a bottom portion of the source region 27 to a bottom portion of the gate region 28. Further, after the formation by thermal decomposition of a thick silicon dioxide film or protecting film 30 over an entire surface of the device, respective portions of the protecting film 30 on the source region 27, the polycrystalline silicon layer or gate electrode 26 and the drain region 28 are removed by etching to form contact holes. Finally, aluminum is applied onto an entire surface of the protecting film 30 and is subject to prescribed etching to form a source electrode 31, a gate drawing-out electrode 32 and a drain electrode 33 as shown in FIG. 2E. Thus is completed a field effect transistor.

In the semiconductor device having the foregoing construction, the $n^+p$ junction is changed at its lower portion into an $n^+p^+$ junction by forming a buried layer having the same conductivity type as that of the gate region and a higher impurity concentration than the gate region, at a lower portion of the junction between the source region and the gate region, i.e., at a portion having no effect upon an area where a channel is formed to permit the transistor operation, so that the substrate potential is kept nearly at the same potential as that of the source region. Namely, the substrate potential is avoided from becoming a floating potential to prevent the occurrence of a phenomenon that leakage current is increased. Further, in addition to presenting no variation at the time of ON-OFF change-over, the device permits, upon being made "ON," the holes in the buried layer to contribute to the formation of a channel, whereby the switching speed is also increased.

In the above-mentioned embodiment, the sapphire substrate is used as the insulator substrate, but alumina, spinel or the like may also be used. Also in these cases, a buried layer can be formed by the diffusion of aluminum from the substrate based on the utilization of an increased speed-diffusion phenomenon. The formation of this buried layer may not necessarily be effected by the diffusion of an impurity from the insulator substrate but effected by, for example, usual ion implantation. The buried layer may be of any height if only that portion of the $pn^+$ junction formed between the $n^+$ conductivity type source region and the $p$ conductivity type gate region which remains free from influencing the channel formation is changed into a $p^+n^+$ junction. Preferably, however, the buried layer is not more than half the height of the gate region, i.e., the thickness of the silicon layer. Though the length of the buried layer may also be of any magnitude, the extension of the buried layer into the source region should be as slight as possible since, in the case of the buried layer being formed over a full length of bottom portion of the source region, the floating capacity between the bottom surface of the source region and the buried layer is increased.

Preferably, said semiconductor or silicon layer is formed to a thickness of $1\mu$ or less, and the gate region is so formed as to have an impurity concentration of $1 \times 10^{15} \text{cm}^{-3}$ or less, while the buried layer is so formed as to have an impurity concentration of $1 \times 10^{17} \text{cm}^{-3}$ or less. By so forming, a greater effect is obtained.

In the above embodiment, silicon is used as the semiconductor layer, but other semiconductors such as, for example, gallium arsenide may be used. Further, this invention is not limited to an $n$ channel type field effect transistor but may be applied also to a $p$ channel type field effect transistor. Also in this case, the buried layer is required to have the same conductivity type as that of the gate region and a higher impurity concentration than the gate region, namely is required to be of $n^+$ conductivity type.

What is claimed is:

1. A field effect transistor comprising:
   an insulating substrate,
   a semiconductor layer having a prescribed height, formed on said substrate,
   source, gate and drain regions formed in said semiconductor layer in the height direction of said semiconductor layer entirely over said prescribed height thereof,
   said source and drain regions each having a high impurity concentration of one conductivity type and said gate region having an impurity concentration of the other conductivity type, said source and drain regions forming a junction with said gate region which is situated between said source and drain regions,
   a gate electrode provided on said gate region for inducing a channel in said gate region, and
   a buried layer formed in the gate region mounted on the insulating substrate and abutting on the junction between said source and gate regions, and having the same conductivity type as that of said gate region and a higher impurity concentration than said gate region, said buried layer being out of contact with said drain region and having a height not more than half the height of said source and drain regions.

2. A field effect transistor according to claim 1, wherein said buried layer extends into said source region across the junction between said source region and said gate region.

3. A field effect transistor according to claim 1, wherein said insulating substrate is formed of a compound of aluminum; and said buried layer is formed by diffusion of aluminum from said substrate.

4. A field effect transistor according to claim 3, wherein said semiconductor layer is a silicon layer having a thickness of $1\mu$ or less.

5. A field effect transistor according to claim 4, wherein said gate region has an impurity concentration of $1 \times 10^{15} \text{cm}^{-3}$ or less; and said buried layer has an impurity concentration of $1 \times 10^{17} \text{cm}^{-3}$ or less.

* * * * *